(12) United States Patent
Doan

(10) Patent No.: US 6,531,761 B1
(45) Date of Patent: Mar. 11, 2003

(54) HIGH DENSITY DIRECT CONNECT LOC ASSEMBLY

(75) Inventor: Trung T. Doan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 245 days.

(21) Appl. No.: 09/649,803

(22) Filed: Aug. 28, 2000

Related U.S. Application Data

(62) Division of application No. 09/026,839, filed on Feb. 20, 1998, now Pat. No. 6,335,225.

(51) Int. Cl.[7] ............... H01L 23/495; H01L 23/48; H01L 23/52; H01L 29/40
(52) U.S. Cl. ............... 257/666; 257/667; 257/735; 257/784
(58) Field of Search ............... 257/666, 667, 257/735, 784; 438/123, 124, 612, 615, 616, 617

(56) References Cited

U.S. PATENT DOCUMENTS

| | | |
|---|---|---|
| 3,611,061 A | 10/1971 | Segerson |
| 4,860,443 A | 8/1989 | Pessavento |
| 4,862,245 A | 8/1989 | Pashby et al. |
| 5,057,456 A | 10/1991 | Dehaine |
| 5,066,614 A | 11/1991 | Dunaway et al. |
| 5,079,835 A | 1/1992 | Lam |
| 5,138,115 A | 8/1992 | Lam |
| 5,146,308 A | 9/1992 | Chance et al. |
| 5,166,099 A | 11/1992 | Ueda et al. |
| 5,229,328 A | 7/1993 | Bregman et al. |
| 5,245,214 A | 9/1993 | Simpson |
| 5,252,853 A | 10/1993 | Michii |
| 5,326,932 A | 7/1994 | You |
| 5,367,763 A | 11/1994 | Lam |
| 5,375,320 A | 12/1994 | Kinsman et al. |
| 5,381,036 A | 1/1995 | Bigler et al. |
| 5,445,994 A | 8/1995 | Gilton |
| 5,455,200 A | 10/1995 | Bigler et al. |
| 5,497,032 A | 3/1996 | Tsuji et al. |
| 5,498,767 A | 3/1996 | Huddleston et al. |
| 5,587,605 A | 12/1996 | Ramsey et al. |
| 5,592,020 A | 1/1997 | Nakao et al. |
| 5,634,267 A | 6/1997 | Farnworth et al. |
| 5,796,171 A | 8/1998 | Koe et al. |
| 5,817,530 A | 10/1998 | Ball |
| 5,817,540 A | 10/1998 | Wark |
| 5,903,437 A | 5/1999 | Pierson et al. |

*Primary Examiner*—Jerome Jackson
*Assistant Examiner*—Shrinivas H Rao
(74) *Attorney, Agent, or Firm*—TraskBritt

(57) ABSTRACT

An apparatus and method for attaching a semiconductor die to a lead frame wherein the electric contact points of the semiconductor die are relocated to the periphery of the semiconductor die through a plurality of conductive traces. A plurality of leads extends from the lead frame over the conductive traces proximate the semiconductor die periphery and directly attaches to and makes electrical contact with the conductive traces in an LOC arrangement. Alternately, a connector may contact a portion of the conductive trace to make contact therewith.

26 Claims, 15 Drawing Sheets

HIGH DENSITY DIRECT CONNECT LOC ASSEMBLY

CROSS-REFERENCE TO RELATED APPLICATION

This application is a divisional of application Ser. No. 09/026,839 filed Feb. 20, 1998, now U.S. Pat. No. 6,335,225 B1, issued Jan. 1, 2002.

BACKGROUND OF THE INVENTION

1. Field of the Invention

The present invention relates to an apparatus and method for attaching a semiconductor die to a lead frame or other type of connector. More particularly, the present invention relates to relocating electric contact points of a semiconductor die to the periphery of the semiconductor die through a plurality of conductive traces. The leads of the lead frame extend over the conductive traces proximate the semiconductor periphery and directly attach to and make electrical contact with the conductive traces in a variety of arrangements or configurations. Alternately, a connector may be used to contact a portion of the end of a conductive trace located at the periphery of a semiconductor die.

2. State of the Art

Higher performance, lower cost, increased miniaturization of components, and greater packaging density of integrated circuits are goals of the computer industry. Greater integrated circuit density is primarily limited by the space or "real estate" available for mounting a semiconductor die on a substrate such as a printed circuit board. Conventional lead frame design inherently limits package density for a given semiconductor die size because the die-attach paddle of the lead frame must be larger than the die to which it is bonded. The larger the semiconductor die, the less space that remains around the periphery of the die-bonding pad for wire bonding. Furthermore, the wire bonding pads on the standard lead frame provide anchorage for the leads when the leads and the semiconductor die are encapsulated in plastic. Therefore, as the die size is increased in relation to a given package size, there is a corresponding reduction in the space along the sides of the package for the encapsulating plastic which joins the top and bottom of the plastic body at the mold part line and anchors the leads. Thus, as the leads and encapsulant are subjected to the normal stresses of subsequent forming and assembly operations, the encapsulating plastic may crack, compromising package integrity and substantially increasing the probability of premature device failure.

Also, since lead frames are designed for use with a semiconductor die having a specific pattern of bond pads located on the active surface thereof, it is desirable to have the flexibility of changing the bond pad locations of a die so that an existing lead frame design may be used with differing types of die material.

For example, one method of chip attachment which reduces the die size is a so-called "lead-over-chip" ("LOC") arrangement. Conventional LOC devices have a plurality of leads which is disposed on and attached to an active surface of a semiconductor die, thus the name lead-over-chip. A primary advantage of LOC is that the ratio between the size of the semiconductor die and the size of a package which encapsulates the semiconductor die is high. This advantage is achieved because the die attach paddle is not required since the semiconductor die is instead attached to the leads.

U.S. Pat. No. 4,862,245 issued Aug. 29, 1989 to Pashby et al. ("the '245 patent") illustrates an LOC arrangement on a semiconductor die (see FIG. 10). The leads 16 are extended over a semiconductor die 10 toward a central or axial line of bond pads 14 wherein bond wires 12 make the electrical connection between the inner ends of leads 16 and the bond pads 14. In wirebonding, the bond wires 12 are attached, one at a time, to each bond pad 14 on the semiconductor die 10 and extend to a corresponding lead or trace end 16 on a lead frame or printed circuit board (not shown). The bond wires 12 are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. Film-type alpha barriers 18 are provided between the semiconductor die 10 and the leads 16, and are adhered to both, thus eliminating the need for a separate die paddle or other die support aside from the leads 16 themselves. The configuration of the '245 patent assists in limiting the ingress of corrosive environmental contaminants to the active surface of the die, achieves a larger portion of the circuit path length encapsulated in the packaging material applied after wire bonding, and reduces electrical resistance caused by the bond wires 12 by placing the lead ends in closer proximity to the bond pads 14 (i.e. the longer the bond wire, the higher the resistance). Although this configuration offers certain advantages, it requires that bond wires 12 be individually attached between the bond pads 14 and the leads 16. Bond wires have an inherent problem called bond wire sweep. When encapsulating a bare die assembly, the die assembly is generally placed in a mold with a molten encasing material being injected into the mold whereby the encasing material surrounds the die assembly and the material conforms to the mold. However, this process causes stresses on the bond wires. Since the molten encasing material is viscous, it tends to place directional forces on the bond wires as the encasing material is injected into the mold. These directional forces cause the bond wires to stretch, which can, in turn, cause the bond wires to short with adjacent bond wires or bond pads or be pulled from a bond pad or lead to which the wires are bonded.

U.S. Pat. No. 5,252,853 issued Oct. 12, 1993 to Michii illustrates an LOC arrangement on the semiconductor die which does not use bond wires (see FIG. 11). The leads 22 are extended over a semiconductor die 20 toward centrally located bond pads 24 (shown in shadow). The leads 22 extend to a position over their respective bond pads 24 wherein the leads 22 are bonded directly to their bond pads 24 with TAB attachment. Although this direct bonding of the lead to the bond pad eliminates the need for wirebonding, it still requires lengthy leads to make electrical contact between the bonds pads and the lead frame. Film-type alpha barriers 26 are also provided between the semiconductor die 20 and the leads 22.

Therefore, it would be advantageous to develop a technique and a device for increasing integrated circuit density by reducing lead width and reducing bond pad size, using non-complex lead frame configurations, and eliminating bond wires, while using commercially-available, widely-practiced semiconductor device fabrication techniques.

BRIEF SUMMARY OF THE INVENTION

The present invention relates to an apparatus and method for attaching a semiconductor die to a lead frame or other type of connector, such as a clip type. Electric contact points of the semiconductor die of the present invention are relocated to the periphery of a semiconductor die and are in electrical contact with a lead frame or connector. The semiconductor die may be in electrical contact with a lead frame through at least one lead which extends over and directly attaches to its respective electric contact point on the semiconductor die periphery, or through one lead which extends over and is attached to a die contact point with electrical contact being made to the electrical contact point of the die by means of a wire bond, or through one lead which extends adjacent the edge of a die with electrical contact being made to the electrical contact point of the die by means of a wire bond.

The apparatus is constructed by first forming a semiconductor die on a semiconductor wafer. A plurality of electric contact points, such as bond pads, is disposed on an active surface of the semiconductor die. A plurality of conductive traces is formed on the semiconductor die active surface to make a conductive route between each electric contact point and a position proximate to the semiconductor die periphery. A plurality of edge electric contact points may be formed on the periphery of the semiconductor die active surface during the formation of the conductive traces.

The conductive traces can be formed by a number of industry standard techniques, such as: depositing a conductive material on the active surface of the semiconductor die, patterning, and etching the conductive material; depositing a conductive paste on the semiconductor die active surface by silk screening the conductive traces directly thereon; directly extruding a conductive paste to form the conductive traces, or applying an insulative material on the semiconductor die active surface, etching a trough in the insulative material, filling the trough with a conductive material, and removing the excess material. These methods are less expensive than relocating the electric contact points during the semiconductor die fabrication process.

Although the formation of the conductive traces is preferably carried out on the semiconductor wafer, it is understood that the traces can be formed on each semiconductor die after the semiconductor dice have been cut from the semiconductor wafer.

After the electrical traces have been formed on the semiconductor die and the semiconductor die has been cut from the semiconductor wafer, a lead frame is attached to the semiconductor die. In one instance, a plurality of leads from the lead frame is directly attached directly to and forms an electrical contact with the edge electric contact points of the semiconductor die. The direct attachment of the leads eliminates the need for bond wires, which reduces the cost of the apparatus. In another instance, a plurality of leads from the lead frame is directly attached to the die with electrical contact being made to the contact points of the semiconductor die by means of wire bonds. In yet another instance, a plurality of leads from the lead frame is terminated adjacent an edge of the semiconductor die with electrical contact being made with contact points of the semiconductor die by means of connectors.

In one instance, since the present invention provides neither a die-attach paddle nor a plurality of lengthy leads to provide support for both the semiconductor die and attached lead frame, the semiconductor device fabrication technique for the semiconductor die of the present invention may have to be slightly modified over present semiconductor device fabrication techniques to insure that no stresses on the lead frame attached semiconductor die occur prior to the encapsulation step. Such a fabrication technique modification may include providing clips on the lead frame to hold the semiconductor die. Although modifying the fabrication process is a disadvantage, the disadvantage is far outweighed by the benefits realized by the present invention. Since the leads are not required to provide support, they can be designed to be narrower in width. The narrower lead width allows the edge electric contact points to be smaller than relocated electrical contact points. The smaller edge electric contact points allow the semiconductor die size to be reduced or allow a greater number of edge electric contact points to be placed on the semiconductor die periphery. The narrower lead width also results in a smaller lead pitch which serves to reduce the cost of the apparatus. Furthermore, attachment of the leads at the semiconductor die periphery eliminates the need for a film-type alpha barrier between the semiconductor die and the lead, which further reduces the semiconductor die cost.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings, in which:

DETAILED DESCRIPTION OF THE INVENTION

Figure 1A:
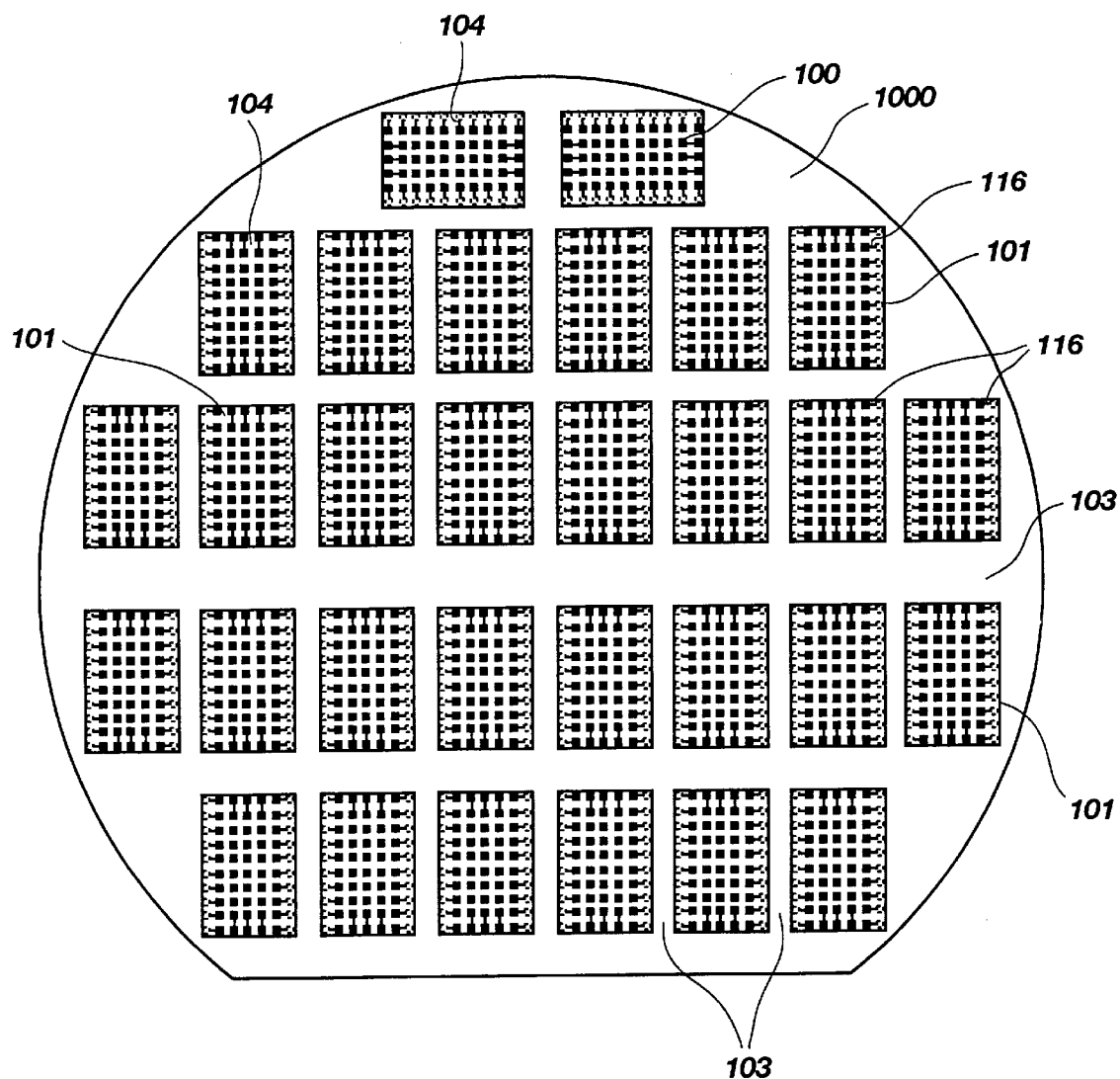
FIGS. 1a–1g are full and partial views of a first preferred method of forming conductive traces on the semiconductor die of the present invention in wafer form or individual die form.
Figure 1B:
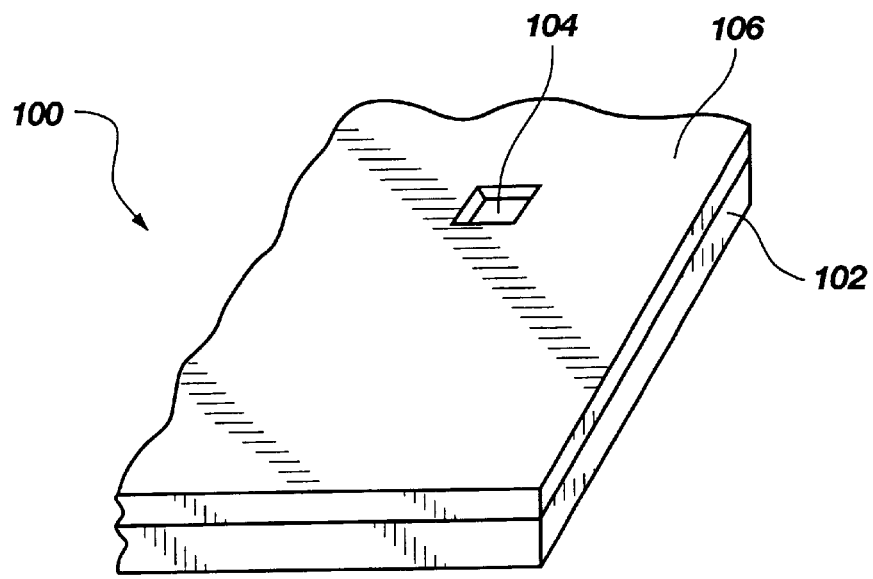
Figure 1C:
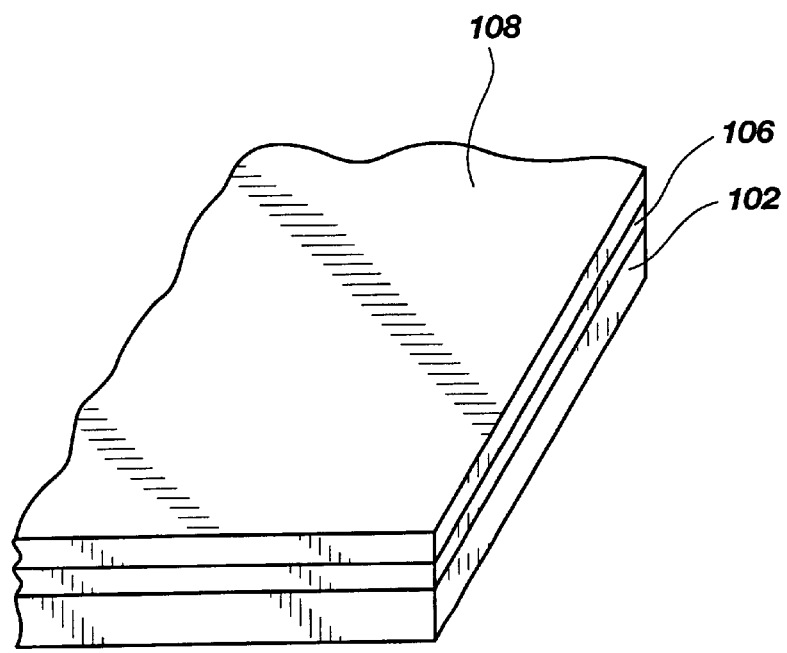
Figure 1D:
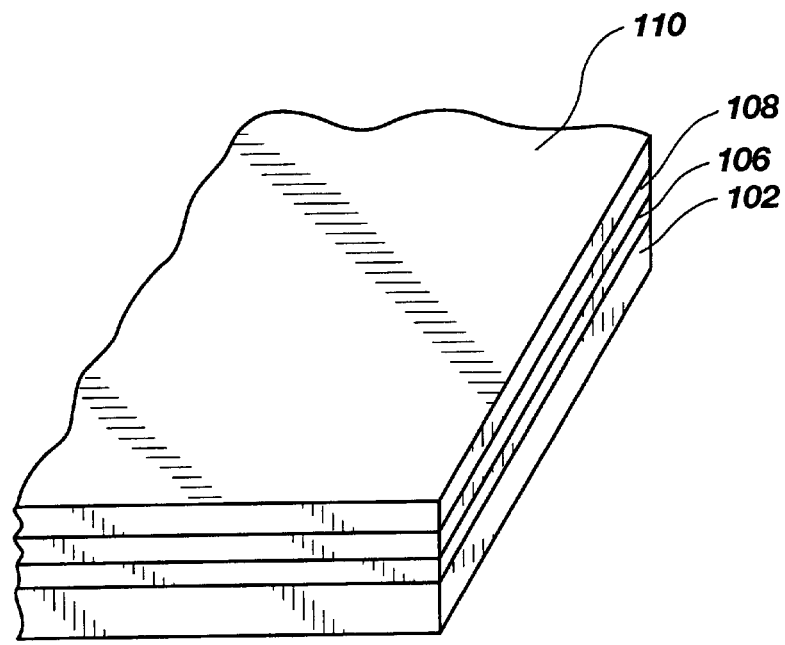
Figure 1E:
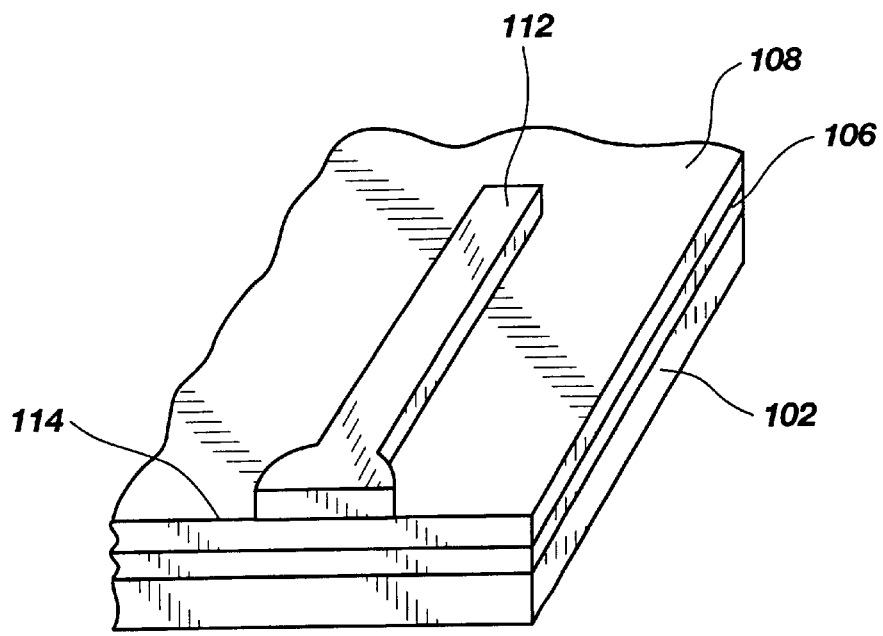
Figure 1F:
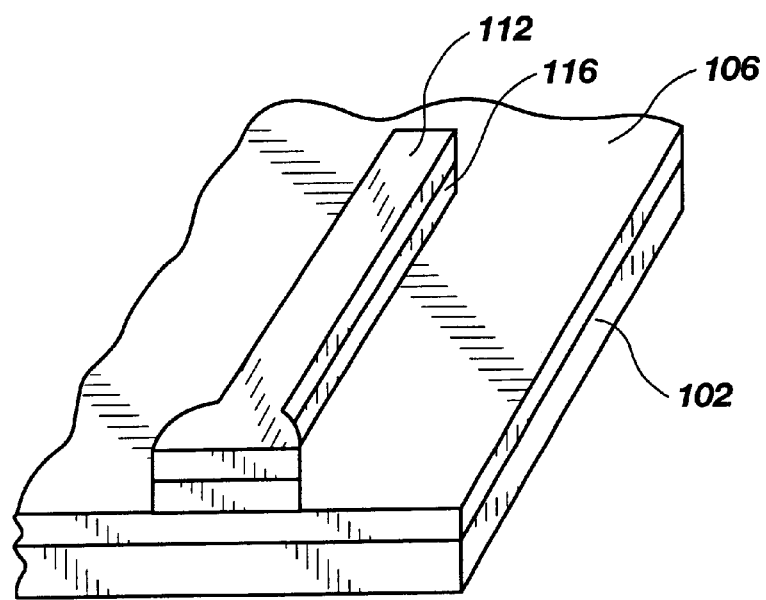
Figure 1G:
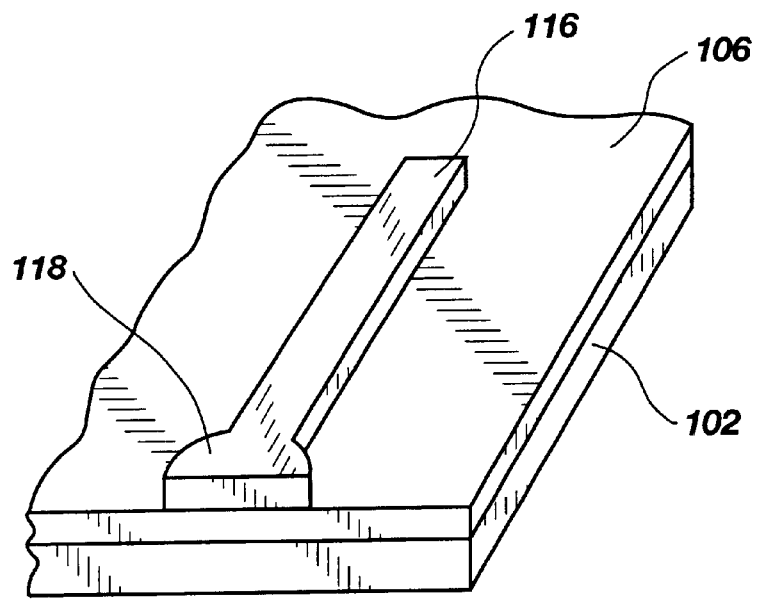

FIGS. 1a–1g illustrate a first method of forming conductive traces on a semiconductor die 100 of the present invention. FIG. 1a illustrates a plurality of semiconductor dice 100 located on a wafer 1000, each die 100 having a periphery 101 defined, in general, by the street areas 103 located therebetween of the wafer 10. Each semiconductor die 100 has conductive traces 116 on an active surface thereof connecting the bond pads 104 of the die to the periphery 101 of the die 100. FIG. 1b illustrates a silicon substrate 102 having circuitry (not shown) disposed on an active surface. The circuitry of the silicon substrate 102 receives input and/or distributes output via bond pads or electric contact points 104 disposed on the semiconductor die active surface. A passivation layer 106 is generally applied over the semiconductor die active surface with the bond pads 104 exposed. As shown in FIG. 1c, a layer of conductive material 108 is applied over the passivation layer 106, making electrical contact with the bond pad 104. A layer of etch resist material 110 is applied over the layer of conductive material 108, as shown in FIG. 1d. The etch resist material layer 110 is then masked and etched to form a trace pattern 112 which extends from the bond pad (not shown) to an edge 114 of the silicon substrate 102 and exposing a portion of the conductive material layer 108, as shown in FIG. 1e. The conductive material layer 108 is then etched, as shown in FIG. 1f, wherein the trace pattern 112 acts as a mask to form a conductive trace 116 from the conductive material layer 108. As shown in FIG. 1g, the trace pattern 112 is stripped to expose the conductive trace 116. The conductive trace 116 may have a landing portion 118 proximate to the silicon substrate edge 114. The landing portion 118 may be slightly wider than the conductive trace 116 and serves as the contact sight to attach a lead (not shown) from a lead frame (not shown).

Figure 2A:
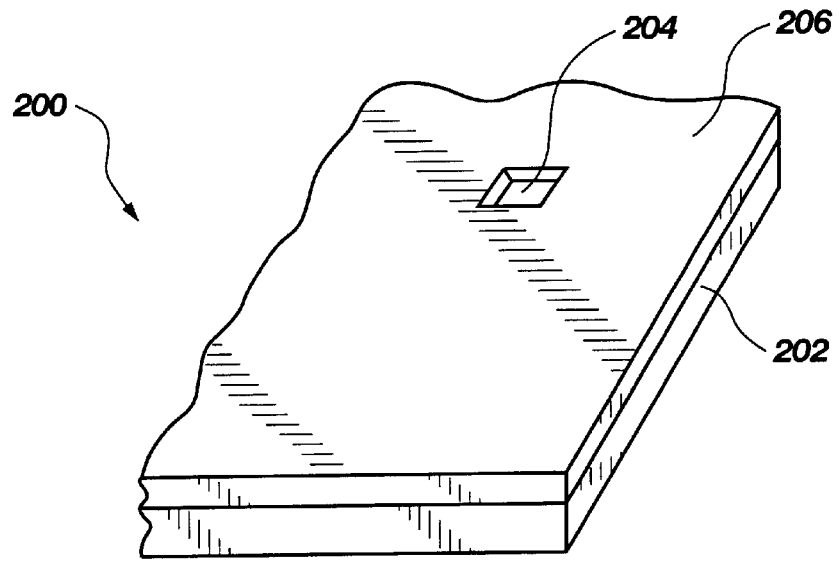
FIGS. 2a–2c are partial views of a second preferred method of forming conductive traces on the semiconductor die of the present invention.
Figure 2B:
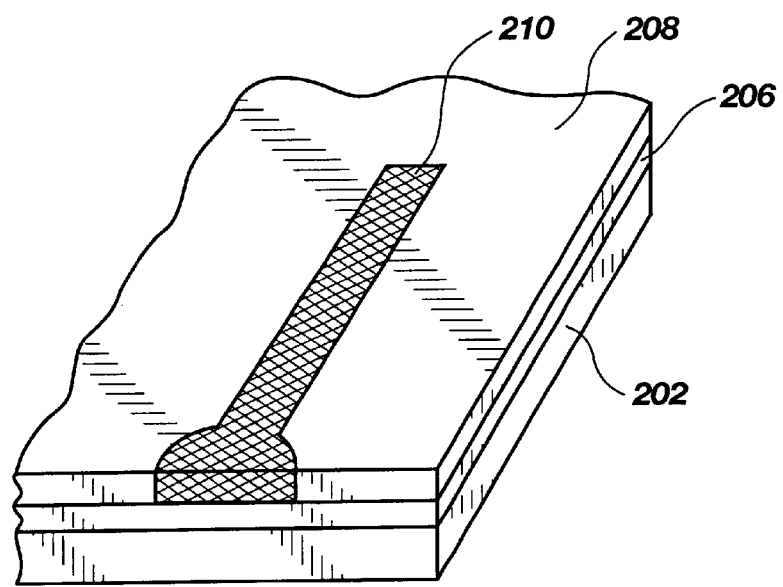
Figure 2C:
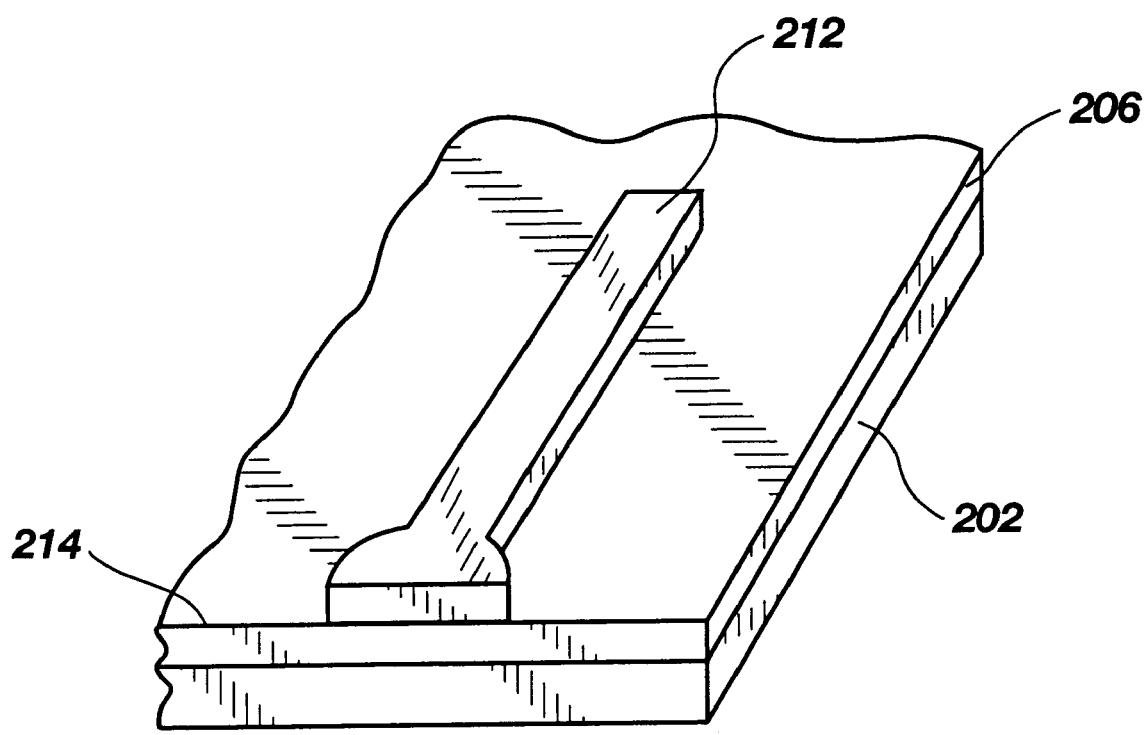

FIGS. 2a–2c illustrate a second method of forming conductive traces on a semiconductor die 200 of the present invention. FIG. 2a illustrates a silicon substrate 202 having circuitry (not shown) disposed on an active surface. The circuitry of the silicon substrate 202 receives input and/or distributes output via bond pads or electric contact points 204 disposed on the semiconductor die active surface. A passivation layer 206 is generally applied over the semiconductor die active surface with the bond pads 204 exposed. As shown in FIG. 2b, a silk screen 208 is placed over the passivation layer 206. The silk screen 208 has a permeable portion 210 in the shape of a desired conductive trace. The silk screen permeable portion 210 allows a substantially liquid conductive material to pass therethrough and attach to the passivation layer 206 to form a conductive trace 212, as shown in FIG. 2c, which makes electrical contact with the bond pad 204 and extends to an edge 214 of the silicon substrate 202.

Figure 3A:
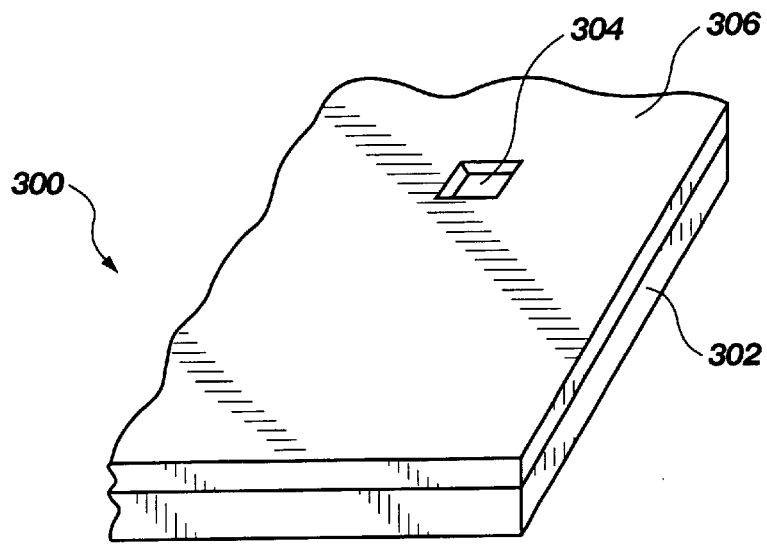
FIGS. 3a–3c are partial views of a third preferred method of forming conductive traces on the semiconductor die of the present invention.
Figure 3B:
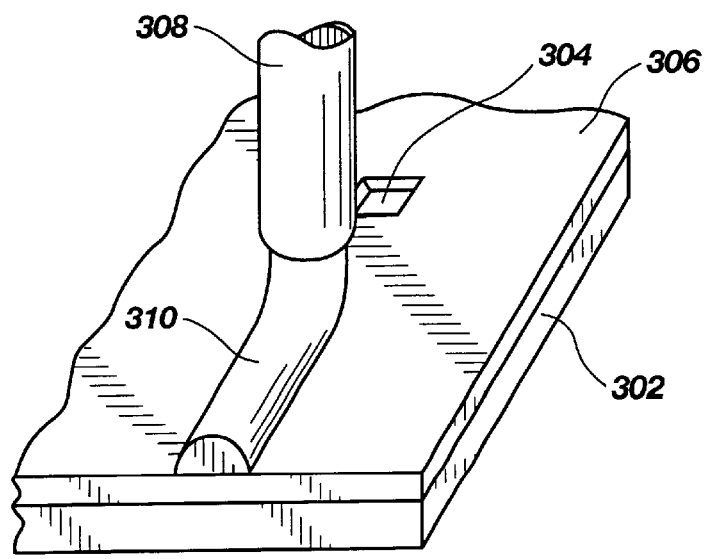
Figure 3C:
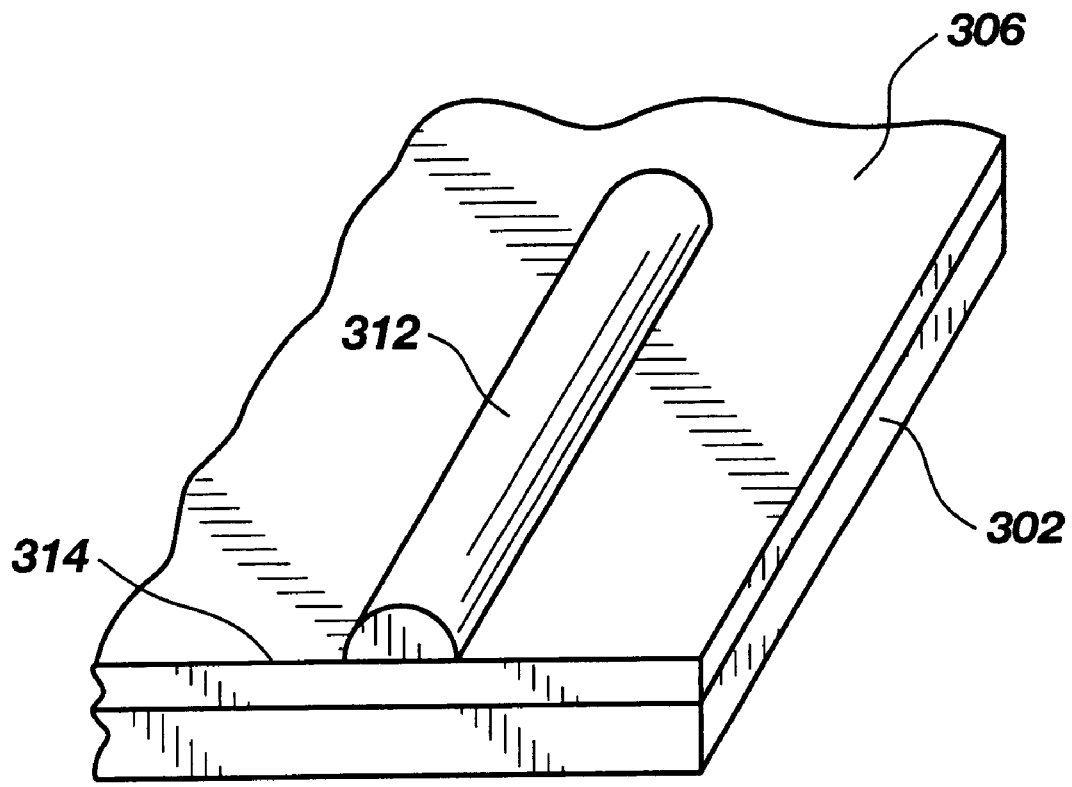

FIGS. 3a–3c illustrate a third method of forming conductive traces on a semiconductor die 300 of the present invention. FIG. 3a illustrates a silicon substrate 302 having circuitry (not shown) disposed on an active surface. The circuitry of the silicon substrate 302 receives input and/or distributes output via bond pads or electric contact points 304 disposed on the semiconductor die active surface. A passivation layer 306 is generally applied over the semiconductor die active surface with the bond pads 304 exposed. As shown in FIG. 3b, an extrusion nozzle 308 extrudes a viscous conductive material 310 directly onto the passivation layer 306. The viscous conductive material 310 forms a conductive trace 312 between the bond pad 304 and an edge 314 of the silicon substrate 302.

Figure 4A:
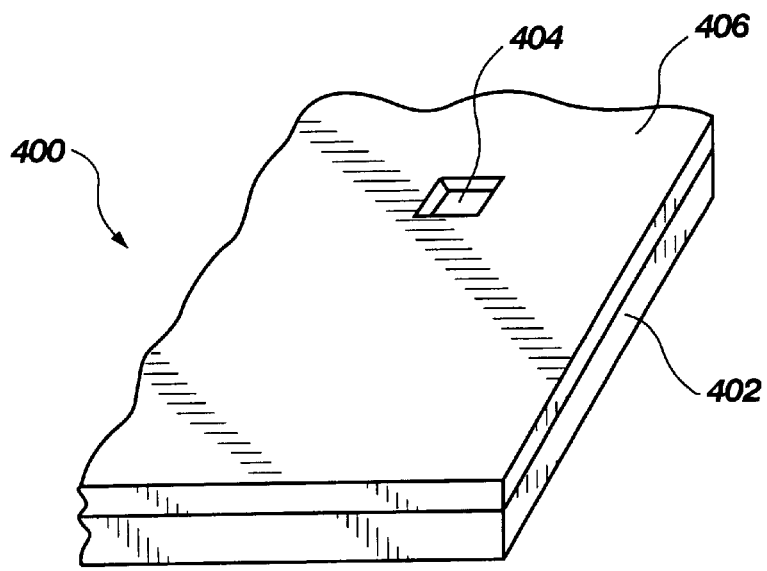
FIGS. 4a–4d are partial views of a fourth preferred method of forming conductive traces on the semiconductor die of the present invention.
Figure 4B:
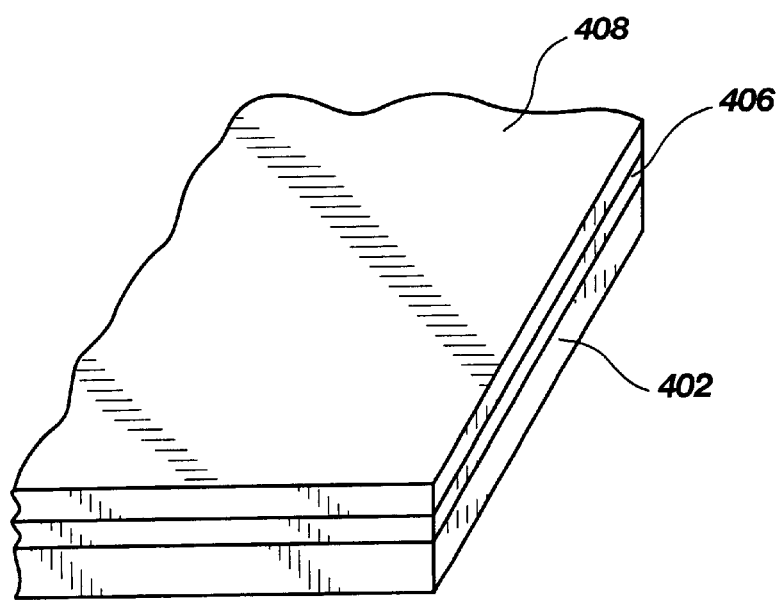
Figure 4C:
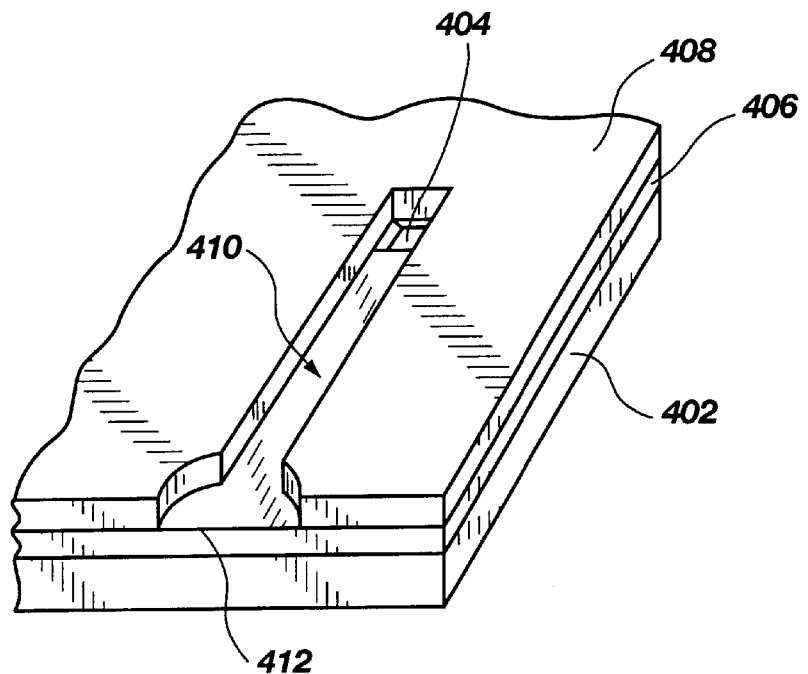
Figure 4D:
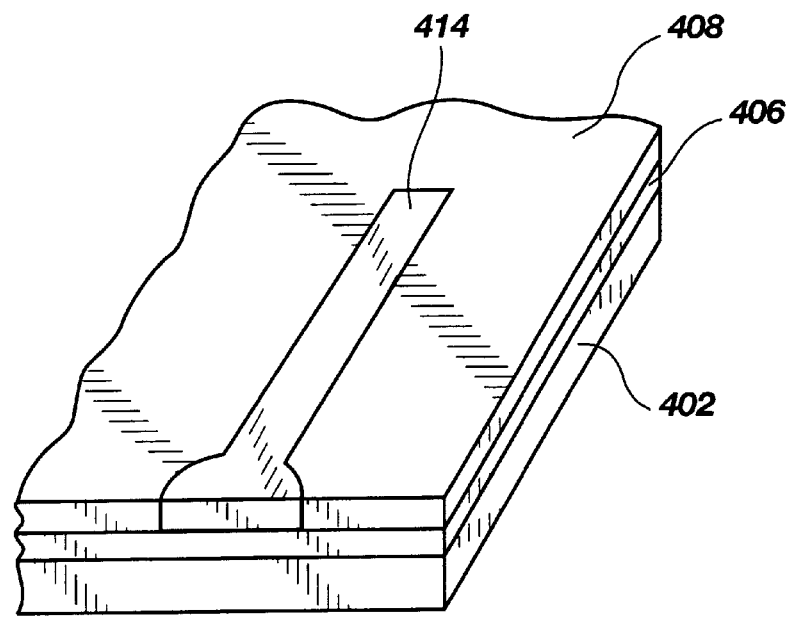

FIGS. 4a–4d illustrate a fourth method of forming conductive traces on the semiconductor die 400 of the present invention. FIG. 4a illustrates a silicon substrate 402 having circuitry (not shown) disposed on an active surface. The circuitry of the silicon substrate 402 receives input and/or issues output via bond pads or electric contact points 404 disposed on the semiconductor die active surface. A passivation layer 406 is generally applied over the semiconductor die active surface with the bond pads 404 exposed. As shown in FIG. 4b, a layer of etch resist material 408 is applied over the passivation layer 406. The etch resist material layer 408 is then masked and etched to form a recessed conductive trace pattern 410 which exposes the bond pad 404 and extends to an edge 412 of the silicon substrate 402, as shown in FIG. 4c. A conductive material is disposed within the recessed conductive trace pattern 410 which forms a conductive trace 414, as shown in FIG. 4d.

Figure 5:
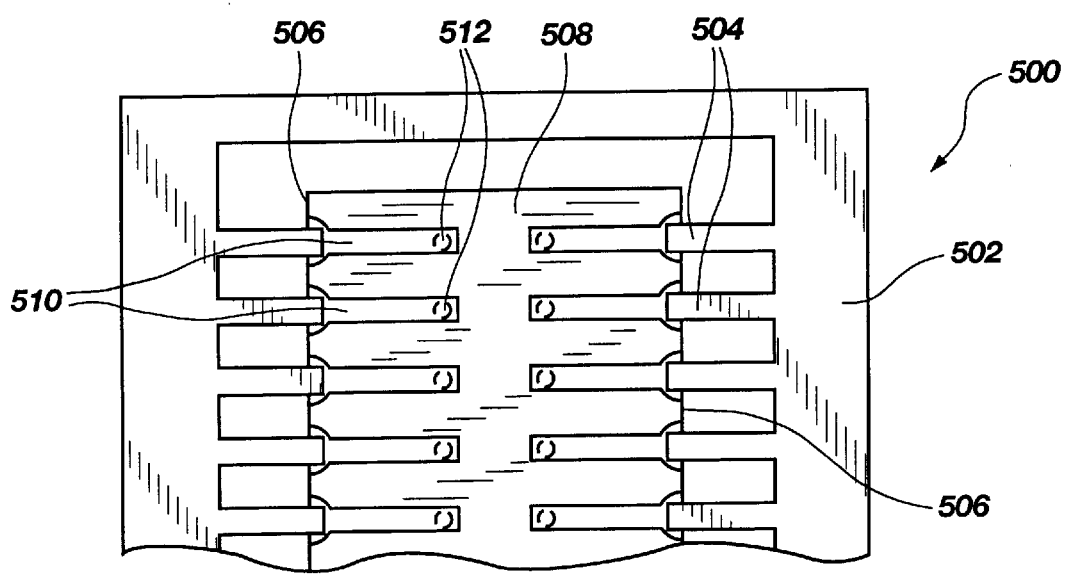
FIG. 5 is a top view of a lead arrangement of the present invention.

FIG. 5 illustrates a semiconductor assembly 500 of the present invention. The semiconductor assembly 500 comprises a lead frame 502 having a plurality of leads 504 extending therefrom. The leads 504 extend to a periphery 506 of semiconductor die 508 wherein the leads 504 extend over, directly attach to, and make electrical contact with a plurality of respective conductive traces 510 which is attached to the semiconductor die 508. The conductive traces 510 each terminate proximate to the semiconductor die periphery 506 and extend to make electrical contact with a plurality of bond pads or electrical contact points 512 (shown in shadow) disposed on the semiconductor die 508.

Figure 6:
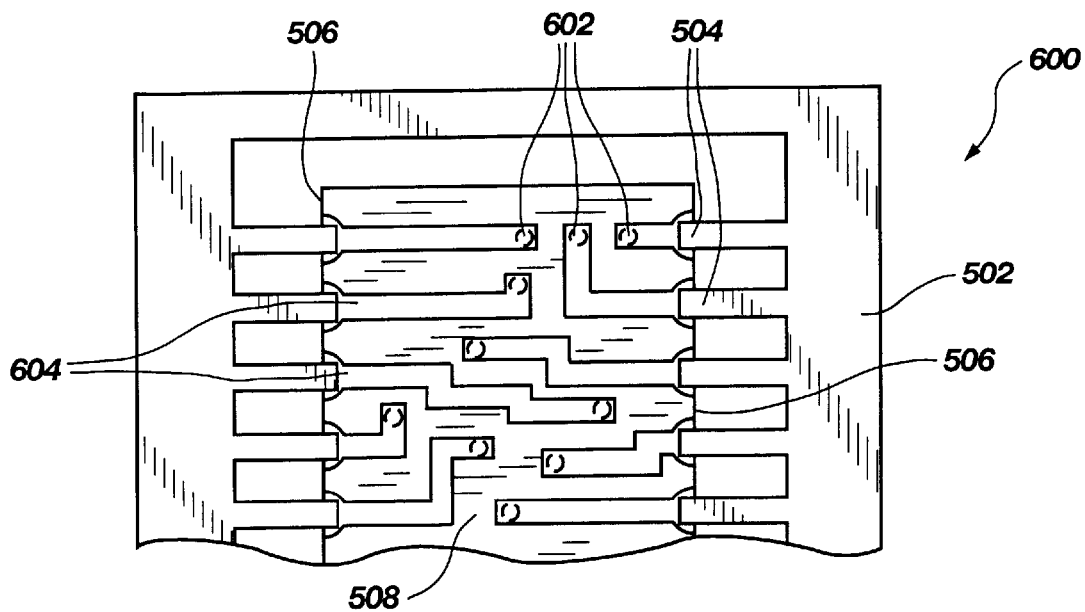
FIG. 6 is a top view of a first alternative lead arrangement of the present invention.

FIG. 6 illustrates an alternative semiconductor assembly 600 of the present invention. The alternative semiconductor assembly 600 is similar to the semiconductor assembly 500 of FIG. 5; therefore, components common to FIGS. 5 and 6 retain the same numeric designation. The difference between the alternative semiconductor assembly 600 and the semiconductor assembly 500 is that the bond pads 602 are variably disposed on the semiconductor die 508, rather than in linear rows, as shown in FIG. 5 for bond pads 512. Thus, the conductive traces 604 for alternate semiconductor assembly 600 are of variable shape and configuration in order to route the conductive traces 604 to their appropriate position on the semiconductor die periphery 506.

Figure 7:
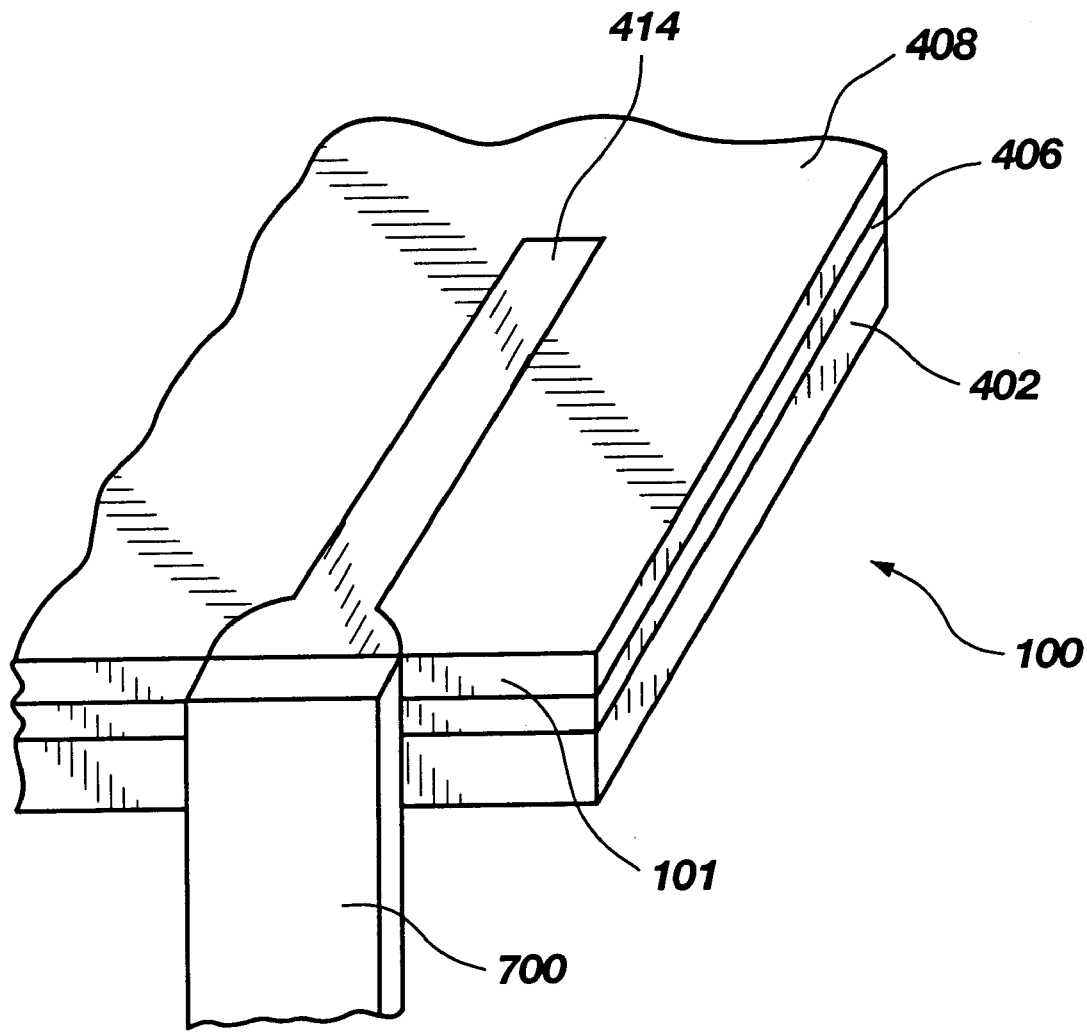
FIG. 7 is a view of an alternative connector arrangement of the present invention.

Referring to drawing FIG. 7, a semiconductor die 100 is illustrated having a conductive trace 414 extending to the periphery 101 of the die 100. Making electrical contact with a portion of the second end of the conductive trace 414 is a portion of a connector 700. The connector 700 resiliently abuts the periphery 101 of the semiconductor die 100, making contact with a portion of the second end of conductive trace 414. The connector 700 may be any suitable type, such as a clip-type connector, to resiliently engage the conductive trace 414 of the semiconductor die 100. Any desired number of connectors 700 may be used for such a purpose. Further, if desired, the connector 700 may be resiliently biased through the use of springs, elastomers, etc. in contact with conductive trace 414.

Figure 8:
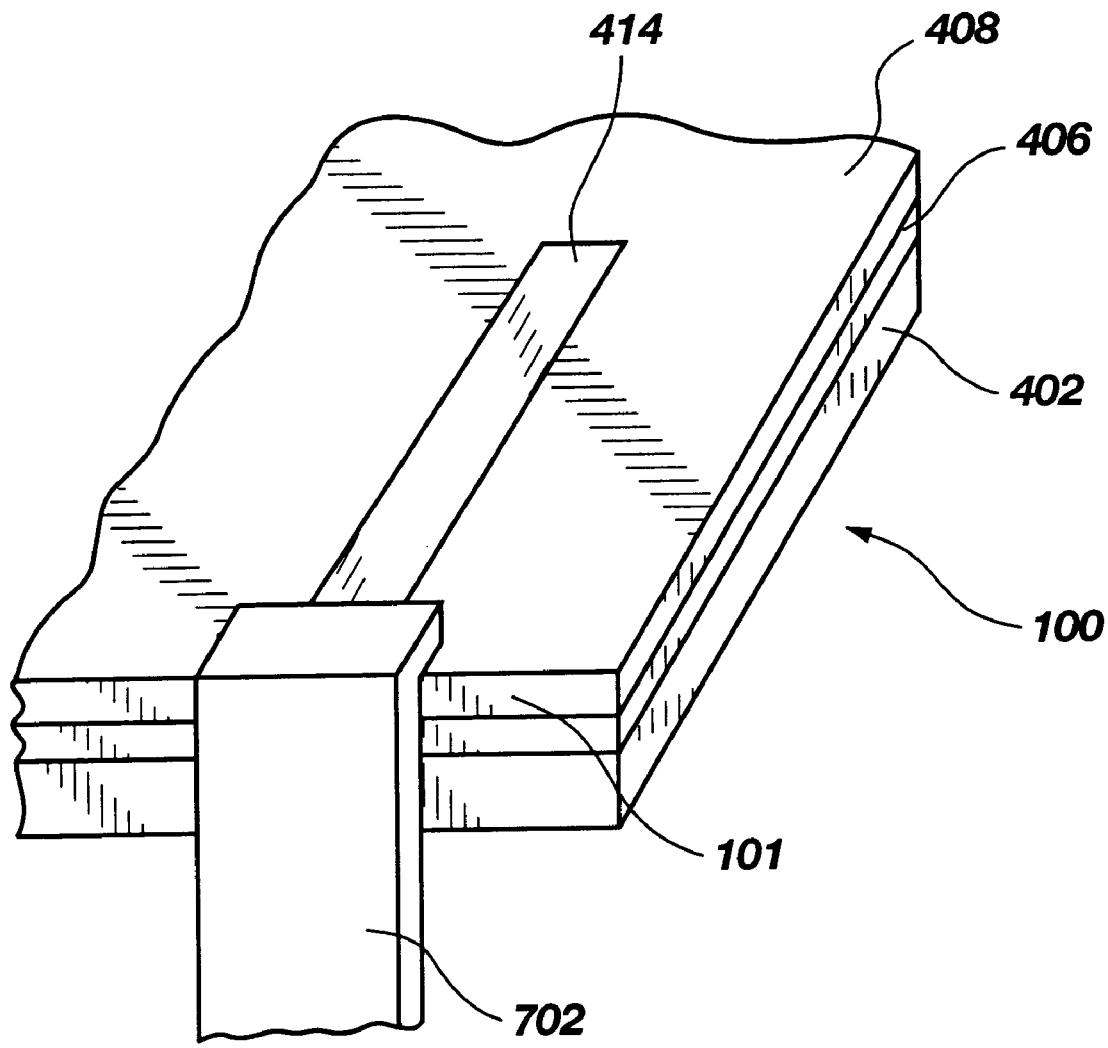
FIG. 8 is a view of an alternative connector arrangement of the present invention.

Referring to drawing FIG. 8, a connector 702 is illustrated making contact with a portion of the second end of the conductive trace 414 and a portion of the upper surface of the trace 414 adjacent the periphery of the semiconductor die 100. The connector 702 may be of any suitable type and may be used in any desired number to connect the conductive traces 414 of the semiconductor die 100 to a substrate. Further, the connector 702 may be resiliently biased into engagement with the conductive trace 414.

Figure 9:
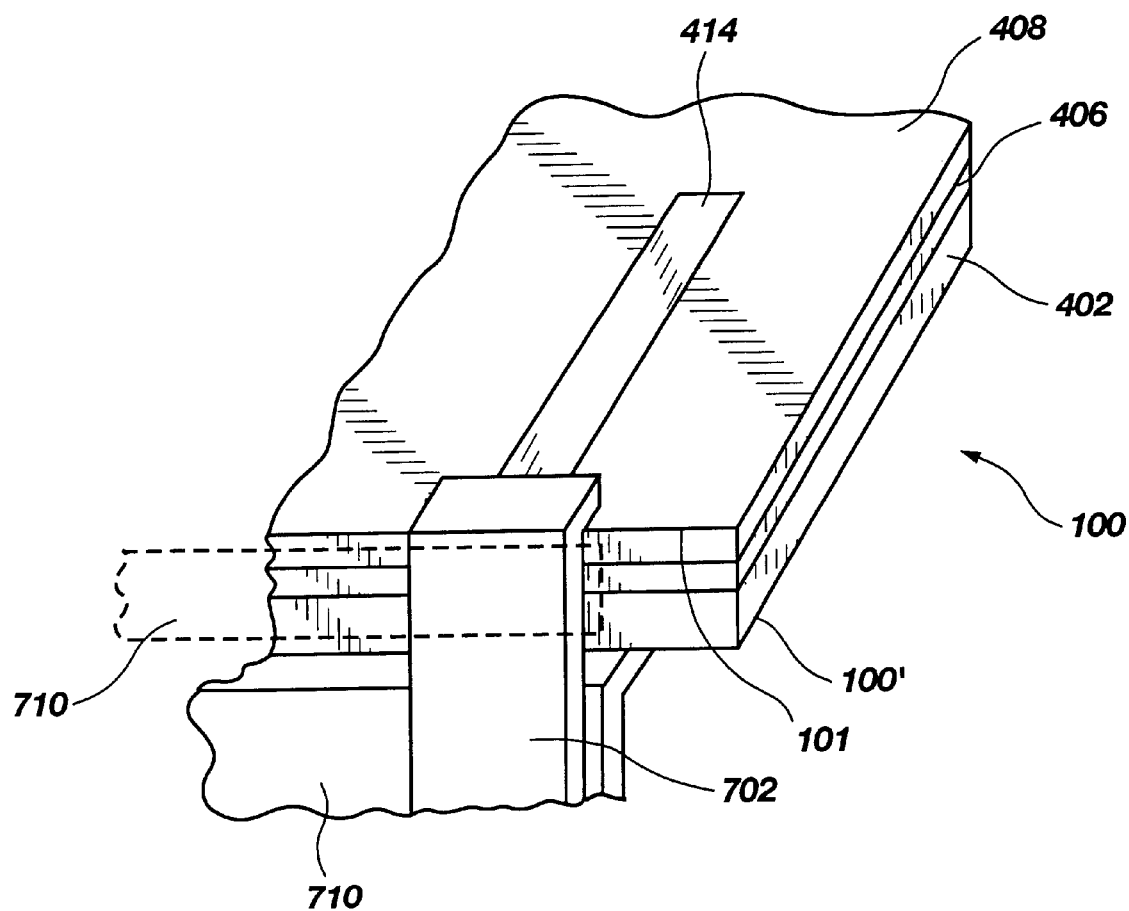
FIG. 9 is a view of an alternative connector arrangement of the present invention.
Figure 10:
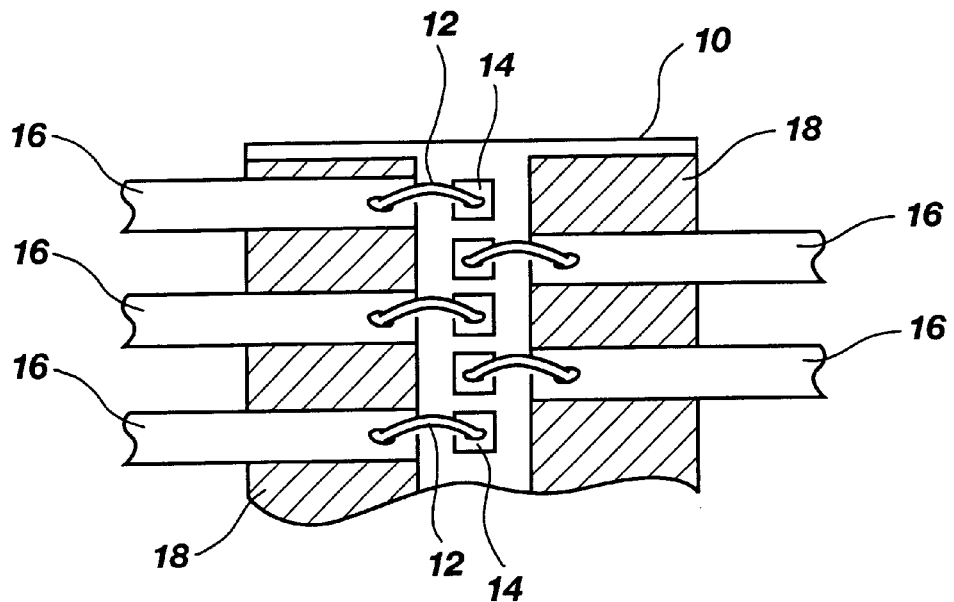
FIG. 10 is a top view of a prior art semiconductor die assembly using leads extending onto the semiconductor die and using bond wires to connect the leads to the bond pads prior to the encapsulation of the semiconductor die in a protective coating.
Figure 11:
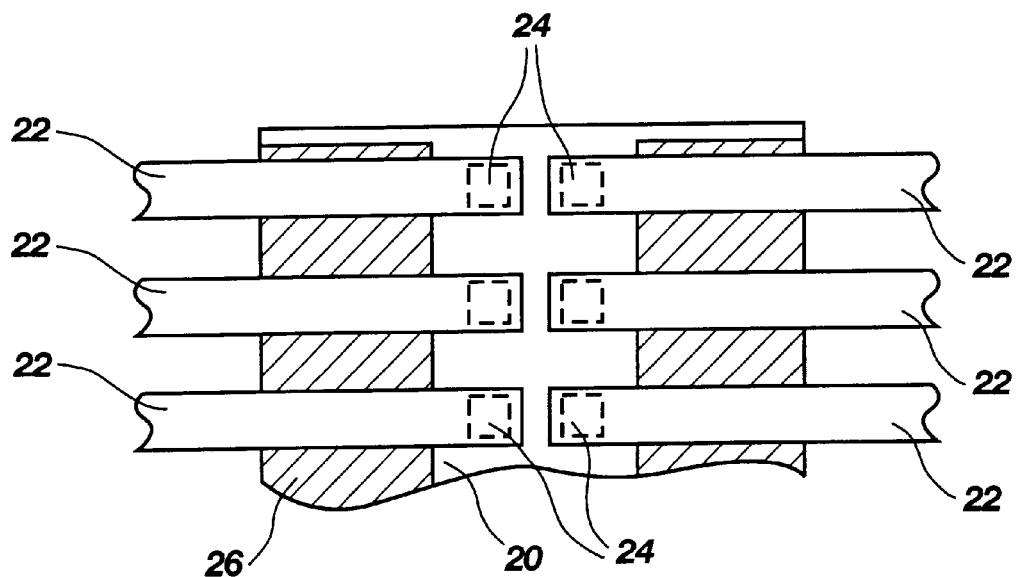
FIG. 11 is a top view of a prior art semiconductor die assembly using leads extending onto the semiconductor die to directly connect to the bond pads prior to the encapsulation of the semiconductor die in a protective coating.

Referring to drawing FIG. 9, a connector 702 is illustrated making contact with a portion of the second end of the conductive trace 414 and a portion of the upper surface of the trace 414 adjacent the periphery 101 of the semiconductor die 100. The connector 702 may be of any suitable type and may be used in any desired number to connect the conductive traces 414 of the semiconductor die 100 to a substrate. Also illustrated is a portion 710 resiliently contacting the opposed surface 100' of the semiconductor die 100 to resiliently bias the connector 702 into contact with conductive trace 414. The portion 710 may be part of a suitable connector, a portion of connector 702, etc. Alternately, the portion 710 may bear against the exterior of connector 702 (shown in phantom lines) to bias the connector 702 against the conductive trace 414 at the periphery 101 of the semiconductor die 100.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor die assembly, comprising:
   a semiconductor die having a periphery and an active surface with at least one electric contact point disposed on said active surface;
   at least one conductive trace on said active surface, said at least one conductive trace comprising a first end electrically contacting said at least one electric contact point of said semiconductor die and a second end terminating proximate said semiconductor die periphery, said at least one conductive trace comprising a trace of extruded viscous conductive material on said active surface between said at least one electric contact point making contact therewith and the periphery of the semiconductor die to expose a portion of said at least one conductive trace at a portion of the periphery of said semiconductor die; and
   at least one connector connected to and in electrical communication with said conductive trace second end.

2. The semiconductor die of claim 1, wherein said at least one connector is resiliently biased to connect to said conductive trace second end.

3. A semiconductor die on a wafer, comprising:
   a semiconductor die having a periphery and an active surface with at least one electric contact point disposed on said active surface; and
   at least one conductive trace on said active surface, said at least one conductive trace having a first end electrically contacting said at least one electric contact point of said semiconductor die proximate said semiconductor die periphery, said at least one conductive trace comprising a trace of extruded viscous conductive material on said active surface between said at least one electric contact point making contact therewith and the periphery of the semiconductor die to expose a portion of said at least one conductive trace at a portion of the periphery of said semiconductor die.

4. A plurality of semiconductor dice on a wafer, comprising:
   a plurality of semiconductor dice located on said wafer, each semiconductor die having a periphery and an active surface with at least one electric contact point disposed on said active surface; and
   at least one conductive trace on said active surface, said at least one conductive trace comprising a first end electrically contacting said at least one electric contact point of said semiconductor die and a second end terminating proximate said semiconductor die periphery, said at least one conductive trace comprising a trace of extruded viscous conductive material on said active surface between said at least one electric contact point making contact therewith and the periphery of the semiconductor die to expose a portion of said at least one conductive trace at a portion of the periphery of said semiconductor die.

5. A semiconductor die assembly, comprising:
   a semiconductor die having a periphery and an active surface with at least one electric contact point disposed on said active surface;
   at least one conductive trace on said active surface, said at least one conductive trace comprising a first end electrically contacting said at least one electric contact point of said semiconductor die and a second end terminating proximate said semiconductor die periphery, said at least one conductive trace comprising a trace of extruded viscous conductive material on said active surface between said at least one electric contact point making contact therewith and the periphery of the semiconductor die to expose a portion of said at least one conductive trace at a portion of the periphery of said semiconductor die; and
   at least one lead of a connector connected to and in electrical communication with said conductive trace second end.

6. A semiconductor die assembly, comprising:
   a semiconductor die having a periphery and an active surface with at least one electric contact point disposed on said active surface;
   at least one conductive trace on said active surface, said at least one conductive trace comprising a first end electrically contacting said at least one die electric contact point of said semiconductor die and a second end terminating proximate said semiconductor die periphery, said at least one conductive trace comprising a trace of extruded viscous conductive material on said active surface between said at least one electric contact point making contact therewith and the periphery of the semiconductor die to expose a portion of said at least one conductive trace at a portion of the periphery of said semiconductor die; and
   at least one lead of a connector connected to and in electrical communication with said conductive trace second end, said at least one lead being resiliently biased into engagement with said conductive trace.

7. A semiconductor die assembly, comprising:
   a semiconductor die having a periphery and an active surface wit at least one electric contact point disposed on said active surface;
   at least one conductive trace on said active surface, said at least one conductive trace comprising a first end electrically contacting said at least one electric contact point of said semiconductor die and a second end terminating proximate said semiconductor die periphery, said at least one conductive trace comprising a trace of extruded viscous conductive material on said active surface between said at least one electric contact point making contact therewith and the periphery of the semiconductor die to expose a portion of said at least one conductive trace at a portion of the periphery of said semiconductor die; and
   at least one lead of a connector connected to and in electrical communication with said conductive trace second end, said at least one lead being resiliently biased into engagement with said second end of said conductive trace.

8. A semiconductor die assembly, comprising:
a semiconductor die having a periphery and an active surface with at least one electric contact point disposed on said active surface;
at least one conductive trace on said active surface, said at least one conductive trace comprising a first end electically contacting said at least one electric contact point of said semiconductor die and a second end terminating proximate said semiconductor die periphery, said at least one conductive trace comprising a trace of extruded viscous conductive material on said active surface between said at least one electric contact point making contact therewith and the periphery of the semiconductor die to expose a portion of said at least one conductive trace at a portion of the periphery of said semiconductor die; and
at least one lead of a lead frame attached to and in electrical communication with said conductive trace second end.

9. The semiconductor die of claim 8, wherein said at least one lead of a lead frame is abutted to and in electrical communication with a portion of said conductive trace second end.

10. The s conductor die of claim 8, wherein said at least one lead of a lead frame is abutted to and in electrical communication with a portion of said conductive trace second end without a permanent connection thereto.

11. The semiconductor die of claim 8, wherein said at least one lead of a lead frame is resiliently attached to and in electrical communication with said conductive trace second end.

12. A semiconductor die assembly, comprising:
a semiconductor die having a periphery and an active surface having a plurality of electric contact points disposed on said active surface;
a plurality of conductive traces on said active surface, each conductive trace of said plurality of traces comprising a first end electrcally contacting at least one electric contact point of said plurality of contact points and a second end terminating proximate said semiconductor die periphery, said each conductive trace comprising a trace of extruded viscous conductive material on said active surface between said at least one semiconductor die electric contact point making contact therewith and the periphery of the semiconductor die; and
a plurality of leads of a lead fame connected to and in electrical communication with said second ends of said plurality of conductive traces.

13. The semiconductor die of claim 12, wherein said plurality of leads of said lead frame are resiliently connected to and in electrical communication with portions of said second ends of said plurality of conductive traces.

14. A semiconductor die, comprising:
a semiconductor die having a periphery, having an active surface, and having at least one bond pad disposed on said active spice;
at least one conductive trace on said active surface of said semiconductor die, said at least one conductive trace comprising a first end contacting said at least one bond pad of said semiconductor die and a second end terminating proximate said periphery of said semiconductor die, said at least one conductive race comprising a trace of extruded viscous conductive material on said active surface between said at least one bond pad making contact therewith and the periphery of the semiconductor die to expose a portion of said at least one conductive trace at a portion of the periphery of said semiconductor die; and
at least one connector hang a portion thereof connected to said second end of said conductive trace second end.

15. The semiconductor die of claim 14, wherein said at least one connector includes a resiliently biased connector for connecting to said conductive trace second end.

16. A semiconductor die on a wafer, comprising:
a semiconductor die having a periphery, having an active surface, and having at least one bond pad on said active surface; and
at least one conductive trace on said active surface of said semiconductor die, said at least one conductive trace comprising a first end contacting said at least one bond pad of said semiconductor die and a second end terminating adjacent said periphery of said semiconductor die, said at least one conductive trace comprising a trace of extruded viscous conductive material on said active surface between said at least one bond pad making contact therewith and the periphery of the semiconductor die to expose a portion of said at least one conductive trace at a portion of the periphery of said semiconductor die.

17. A plurality of semiconductor dice on a wafer, comprising:
a plurality of semiconductor dice located on said wafer, each semiconductor die having a periphery, having an active surface, and having at least one bond pad on said active surface; and
at least one conductive trace on said active surface of each of said plurality of semiconductor dice, said at least one conductive trace comprising a first end contacting said at least one bond pad of said semiconductor die and a second end terminating adjacent said periphery of said semiconductor die periphery, said at least one conductive trace comprising a trace of extruded viscous conductive material on said active surface between said at least one bond pad making contact therewith and the periphery of the semiconductor die.

18. A semiconductor die assembly, comprising:
a semiconductor die having a periphery, having an active surface, and having at least one bond pad on said active surface;
at least one conductive trace on said active surface of said semiconductor die, said at least one conductive trace comprising a first end contacting said at least one bond pad of said semiconductor die and a second end terminating adjacent said periphery of said semiconductor die, said at least one conductive trace comprising a trace of extruded viscous conductive material on said active surface between said at least one bond pad making contact therewith and the periphery of the semiconductor die to expose a portion of said at least one conductive trace at a portion of the periphery of said semiconductor die; and
at least one lead of a connector connected to said second end of said conductive trace.

19. A semiconductor die, comprising:
a semiconductor die having a periphery, having an active surface, and having at least one bond pad on said active surface;
at least one conductive trace on said active surface of said semiconductor die, said at least one bond pad comprising a first end contacting said at least one bond pad of said conductor die and a second end terminating adjacent said periphery of said semiconductor die, said at least one conductive trace comprising a trace of extruded viscous conductive material on said active surface between said at least one bond pad making contact therewith and the periphery of the semiconductor die to expose a portion of said at least one conductive trace at a portion of the periphery of said semiconductor die; and at last one lead of a connector connected to said second end of said conductive trace second end, said at least one lead being resiliently biased into engagement with said conductive trace.

20. A semiconductor die assembly, comprising:

a semiconductor die having a periphery, having an active surface, and having at least one bond pad on said active surface;

at least one conductive trace on said active surface of said semiconductor die, said at least one bond pad comprising a first end contacting said at least one bond pad of said semiconductor die and a second end terminating adjacent said periphery of said semiconductor die, said at least one conductive trace comprising a trace of extruded viscous conductive material on said active surface between said at least one bond pad making contact therewith and the periphery of the semiconductor die to expose a portion of said at least one conductive trace at a portion of the periphery of said semiconductor die; and at least one lead of a connector connected to said second end of said conductive trace, said at least one lead being resiliently biased into engagement with said second end of said conductive trace.

21. A conductor die assembly, comprising:

a semiconductor die having a periphery, having an active surface, and having at least one bond pad on said active surface;

at least one conductive trace on said active surface of said semiconductor die, said at least one conductive trace comprising a first end contacting said at least one bond pad of said semiconductor die and a second end terminating adjacent said periphery of said semiconductor die, said at least one conductive trace comprising a trace of extruded viscous conductive material on said active surface between said at least one bond pad making contact therewith and the periphery of the semiconductor die to expose a portion of said at least one conductive trace at a portion of the periphery of said semiconductor die; and at least one lead of a lead frame attached to said second end of said conductive trace.

22. The semiconductor die of claim 21, wherein said at least one lead of a lead fame abuts a portion of said second end of said conductive trace.

23. The semiconductor die of claim 21, wherein said at least one lead of a lead frame releasably abuts a portion of said second end of said conductive trace.

24. The semiconductor die of claim 21, wherein said at least one lead of a lead frame comprises a resiliently attached at least one lead of a lead frame contacting said second end of said conductive trace.

25. A semiconductor die, comprising:

a semiconductor die having a periphery, having an active surface, and having a plurality of bond pads on said active surface;

a plurality of conductive traces on said active surface of said semiconductor die, each conductive trace of said plurality of traces comprising a first end contacting a bond pad of said plurality of bond pads of said semiconductor die and a second end terminating adjacent said periphery of said semiconductor die, said each conductive trace comprising a trace of extruded viscous conductive material on said active surface between said bond pad making contact therewith and the periphery of the semiconductor die to expose a portion of said at least one conductive trace at a portion of the periphery of said semiconductor die; and a plurality of leads of a lead frame connected to said second ends of said plurality of conductive traces.

26. The semiconductor die of claim 25, wherein said plurality of leads of said lead frame comprise a plurality of leads resiliently connected to portions of said second ends of said plurality of conductive traces.

* * * * *

UNITED STATES PATENT AND TRADEMARK OFFICE
CERTIFICATE OF CORRECTION

PATENT NO. : 6,531,761 B1
APPLICATION NO. : 09/649803
DATED : March 11, 2003
INVENTOR(S) : Trung T. Doan It is certified that error appears in the above-identified patent and that said Letters Patent is hereby corrected as shown below:

On the title page:
In ITEM (56) "References Cited,
 U.S. Patent Documents,"
  2$^{nd}$ COLUMN, 2nd LINE, after "5,138,115  8/1992  Lam" insert --5,138,431  8/1992  Huang et al.--

In the drawings:
In Fig. 1g    insert reference numeral --114-- and lead line therefor

In the specification:
COLUMN 2, LINE 54, change "bonds pads" to --bond pads--
COLUMN 3, LINE 47, change "frame is directly attached directly to" to --frame is attached directly to--

In the claims:
CLAIM 6, COLUMN 8, LINE 32, change "least one die electric" to --least one electric--
CLAIM 7, COLUMN 8, LINE 49, change "surface wit at" to --surface with at--

UNITED STATES PATENT AND TRADEMARK OFFICE
CERTIFICATE OF CORRECTION

PATENT NO.        : 6,531,761 B1                                    Page 2 of 2
APPLICATION NO.   : 09/649803
DATED             : March 11, 2003
INVENTOR(S)       : Trung T. Doan It is certified that error appears in the above-identified patent and that said Letters Patent is hereby corrected as shown below:

Please replace FIG. 1g with the following replacement figure:

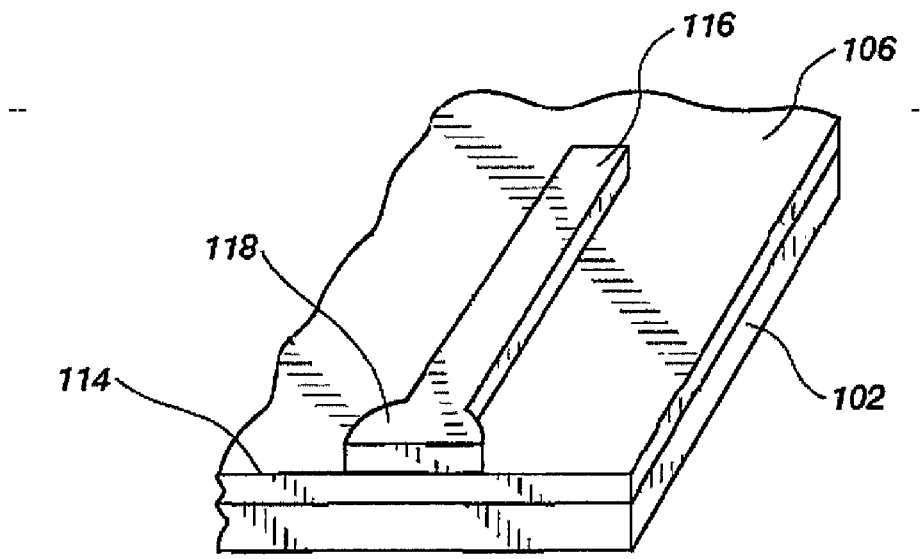

Fig. 1g

Signed and Sealed this

Twenty-sixth Day of June, 2007

JON W. DUDAS
*Director of the United States Patent and Trademark Office*